US011921576B2

(12) United States Patent
Ware et al.

(10) Patent No.: US 11,921,576 B2
(45) Date of Patent: Mar. 5, 2024

(54) MEMORY DEVICE AND REPAIR METHOD WITH COLUMN-BASED ERROR CODE TRACKING

(71) Applicant: Rambus Inc., San Jose, CA (US)

(72) Inventors: Frederick A. Ware, Los Altos Hills, CA (US); Brent Steven Haukness, Sunnyvale, CA (US)

(73) Assignee: Rambus Inc., San Jose, CA (US)

( * ) Notice: Subject to any disclaimer, the term of this patent is extended or adjusted under 35 U.S.C. 154(b) by 61 days.

(21) Appl. No.: 17/548,509

(22) Filed: Dec. 11, 2021

(65) Prior Publication Data

US 2022/0171674 A1 Jun. 2, 2022

Related U.S. Application Data

(63) Continuation of application No. 16/790,637, filed on Feb. 13, 2020, now Pat. No. 11,204,825, which is a continuation of application No. 15/646,025, filed on Jul. 10, 2017, now Pat. No. 10,565,049, which is a continuation of application No. 14/458,546, filed on Aug. 13, 2014, now Pat. No. 9,715,424.

(60) Provisional application No. 61/869,325, filed on Aug. 23, 2013.

(51) Int. Cl.
*G11C 29/00* (2006.01)
*G06F 11/10* (2006.01)
*G06F 12/02* (2006.01)
*G11C 29/52* (2006.01)

(52) U.S. Cl.
CPC ...... *G06F 11/1008* (2013.01); *G06F 11/1048* (2013.01); *G06F 12/0246* (2013.01); *G11C 29/52* (2013.01)

(58) Field of Classification Search
CPC ............ G06F 11/1008; G06F 11/1048; G06F 12/0246; G11C 29/52
See application file for complete search history.

(56) References Cited

U.S. PATENT DOCUMENTS

| 5,568,415 | A | 10/1996 | McLellan et al. |
| 5,598,373 | A | 1/1997 | Wada et al. |
| 6,006,311 | A | 12/1999 | Arimilli et al. |
| 6,223,248 | B1 | 4/2001 | Bosshart |
| 6,438,641 | B1 | 8/2002 | Kanno et al. |
| 7,085,971 | B2 * | 8/2006 | Barth, Jr. ............... G11C 29/72 |
| | | | 365/225.6 |
| 8,347,176 | B2 | 1/2013 | Resnick et al. |
| 2007/0094475 | A1 | 4/2007 | Bridges et al. |
| 2007/0195618 | A1 | 8/2007 | Krech, Jr. et al. |

(Continued)

FOREIGN PATENT DOCUMENTS

WO WO-2012039983 A1 * 3/2012 ............. G06F 11/10

*Primary Examiner* — Christine T. Tu
(74) *Attorney, Agent, or Firm* — Lance Kreisman; Peninsula Patent Group

(57) ABSTRACT

A memory device is disclosed that includes a row of storage locations that form plural columns. The plural columns include data columns to store data and a tag column to store tag information associated with error locations in the data columns. Each data column is associated with an error correction location including an error code bit location. Logic retrieves and stores the tag information associated with the row in response to activation of the row. A bit error in an accessed data column is repaired by a spare bit location based on the tag information.

20 Claims, 12 Drawing Sheets

(56) References Cited

U.S. PATENT DOCUMENTS

| | | |
|---|---|---|
| 2008/0181035 A1 | 7/2008 | Kawasumi |
| 2012/0072786 A1 | 3/2012 | Bahali et al. |
| 2012/0204079 A1 | 8/2012 | Takefman et al. |
| 2012/0221902 A1 | 8/2012 | Ware et al. |
| 2013/0007544 A1 | 1/2013 | Nemazie et al. |
| 2013/0058145 A1 | 3/2013 | Yu et al. |
| 2013/0191701 A1* | 7/2013 | Mueller ............... G06F 11/1048 |
| | | 714/764 |
| 2014/0082459 A1 | 3/2014 | Li et al. |
| 2015/0278017 A1* | 10/2015 | Trezise ................. G11C 29/42 |
| | | 714/764 |

* cited by examiner

MEMORY DEVICE AND REPAIR METHOD WITH COLUMN-BASED ERROR CODE TRACKING

CROSS-REFERENCE TO RELATED APPLICATIONS

This application is a Continuation of U.S. patent application Ser. No. 16/790,637, filed Feb. 13, 2020, entitled MEMORY DEVICE AND REPAIR METHOD WITH COLUMN-BASED ERROR CODE TRACKING, which is a Continuation of U.S. patent application Ser. No. 15/646,025, filed Jul. 10, 2017, entitled MEMORY DEVICE AND REPAIR METHOD WITH COLUMN-BASED ERROR CODE TRACKING, now U.S. Pat. No. 10,565,049, which is a Continuation of U.S. patent application Ser. No. 14/458,546, filed Aug. 13, 2014, entitled MEMORY DEVICE AND REPAIR METHOD WITH COLUMN-BASED ERROR CODE TRACKING, now U.S. Pat. No. 9,715,424, that is a Non-Provisional that claims priority to U.S. Provisional Application No. 61/869,325, filed Aug. 23, 2013, entitled MEMORY DEVICE AND REPAIR METHOD WITH COLUMN-BASED ERROR CODE TRACKING, all of which is incorporated herein by reference in its entirety.

TECHNICAL FIELD

The disclosure herein relates to memory systems, and more specifically to in-system memory repair apparatus and methods.

BACKGROUND

Error codes are used in a variety of signaling systems to detect and, in some cases, correct errors relating to data transmission and storage. The codes generally provide redundancy to the original data so that, when the data is encoded via a particular error code algorithm, a limited number of data errors may be identified and possibly corrected upon decoding. The redundant portions of the encoded data may take the form of checksums, parity bits, or the like, depending on the type of error code employed.

For memory systems that employ error codes, the overhead often employed with the encoding may limit the effectiveness of the code to a single-bit error in a given word. As a result, only a certain number of hard errors, such as those caused by storage cell failures, may be acceptable for a given memory component before the component fails as a reliable device. The failures become even more costly when memory devices are assembled onto memory modules, and the modules discarded for failing to pass final testing.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of memory systems, devices and methods are disclosed herein. One embodiment of a memory device is disclosed that includes a row of storage locations that form plural columns. The plural columns include data columns to store data and a tag column to store tag information associated with error locations in the data columns. Each data column is associated with an error correction location including an error code bit location. Logic retrieves and stores the tag information associated with the row in response to activation of the row. A bit error in an accessed data column is repaired by a spare bit location based on the tag information.

In a further embodiment, a method of operation in a memory device is disclosed. The method includes activating a row of storage cells that form plural columns of bit locations. Tag information is accessed from a tag column of bit locations associated with the row, and is associated with error locations in the plural columns. A data column of bit locations in the row is accessed that includes an error code bit location. Information associated with the accessed column is then compared to the tag information, and an error in the data is repaired based on the comparison.

In yet another embodiment, a method of operation in a memory device is disclosed. The method involves receiving data from a memory controller and comparing addresses associated with the data to stored address information associated with known failures. If the comparing identifies a correlation between the data addresses and the stored address information, a data bit is extracted that corresponds to the correlation. The data bit is then stored in a substitute storage location. The remaining data is then transferred for storage in the memory device.

Figure 1:
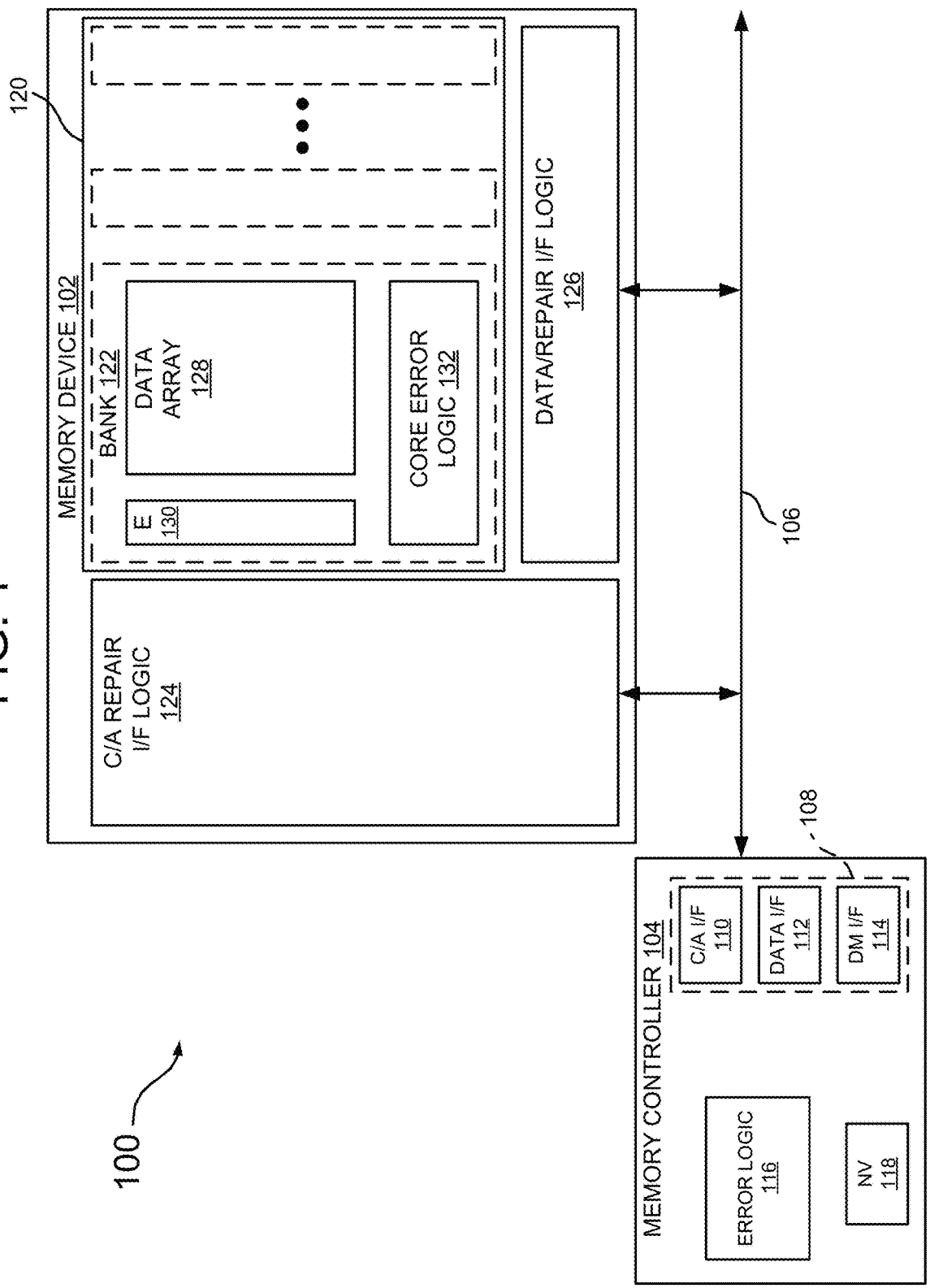
FIG. 1 illustrates one embodiment of a memory system that employs a memory controller and a memory device.

Referring to FIG. 1, one embodiment of a memory system architecture, generally designated 100, employs a memory device 102 coupled to a memory controller 104 via a signaling bus 106. The memory device may be one of a group of devices mounted on, for example, a memory module (not shown). While the following embodiments emphasize dynamic random access memory (DRAM) applications, the system described herein may be employed in any memory environment where relatively high-speed storage and retrieval of information is desired.

Further referring to FIG. 1, the memory controller 104 may take the form of a dynamic random access memory (DRAM) controller that directs the transfer of data, command and address signals within the memory system 100. The memory controller 104 includes an interface 108 that may include a control-address (C/A) interface circuit 110 and a data interface circuit 112. For some embodiments, the controller further includes a data mask interface 114 for write masking operations, and, in some embodiments, to indicate the presence of read data errors, as more fully described below. In some optional embodiments, the memory controller 104 may include error logic 116 to monitor error repair remappings that take place in the memory device 102, and/or include optional non-volatile storage 118 to store the memory remappings. The memory controller 104 may be realized by, e.g., a discrete memory controller separate from a requestor integrated circuit (IC), or any IC that controls a DRAM, including any type of system-on-chip (SoC).

With continued reference to FIG. 1, for one embodiment, the memory device 102 takes the form of a DRAM that includes a memory core 120 with multiple banks 122. The memory device also includes interface circuitry for communicating with the memory controller 104 in the form of control-address (C/A) and repair interface logic 124 and data/repair interface logic 126. The C/A and repair interface logic 124 and the data/repair interface logic 126 may be shared globally with all of the memory device banks in transferring C/A and data signals between the memory device and the memory controller.

Further referring to FIG. 1, each memory device bank 122 generally includes plural storage cells logically organized into a data array 128 to store data and tag information, and an error array 130 having storage cells for storing error correction code (ECC) information and storage cells reserved as spare bits on a per-column basis. As explained in further detail below, the error array 130 is merely a logical representation of additional storage cells that complement and form an extended portion of each column of the data array 128. Core error logic 132 manages the use of the tag and error array information for repair operations. As more fully described below, for some embodiments, the tag information identifies column and bit locations of errors within an accessed row of the data array 128 such that one or more of the spare bits of the error information may be utilized to repair the errors.

Figure 2:
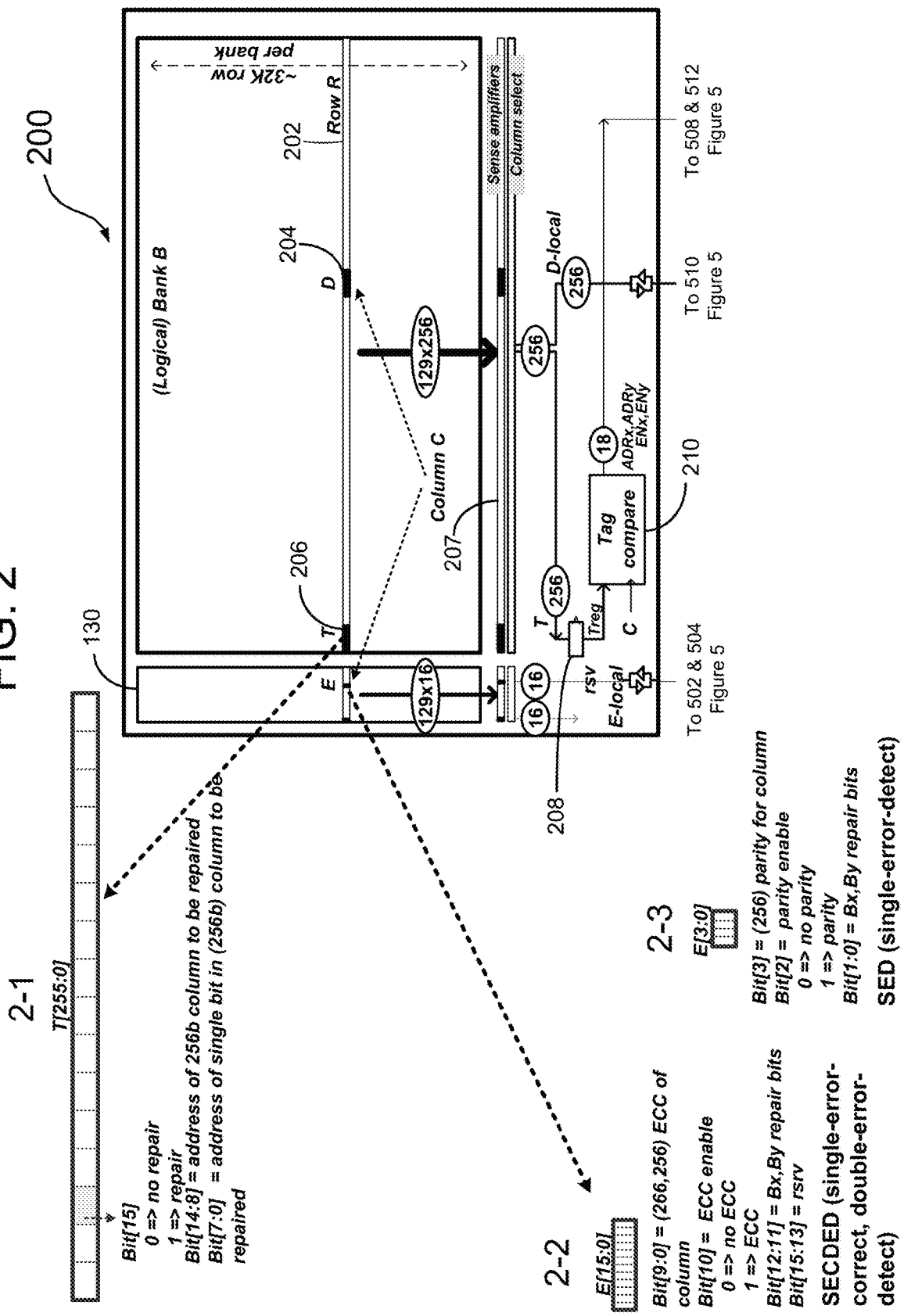
FIG. 2 illustrates an embodiment of a logical arrangement of a bank within a memory core of the memory device of FIG. 1.

FIG. 2 illustrates one specific embodiment of a logical bank arrangement corresponding one of the banks 122 of FIG. 1. The bank, organized logically and generally designated 200, includes plural rows 202 or pages of storage cells that may be accessed via a row address. Each row is organized into plural data columns 204, each of which may be specified by a column address. For some embodiments, a given bank may have on the order of 32,000 rows, with each row having on the order of 128 addressable data columns. In addition to the data columns 204, each row also includes a tag column 206 that includes error and repair information associated with each data column of a given row. One embodiment of a data structure for a tag column 206 is shown in detailed portion labeled 2-1, illustrating sixteen 16-bit fully associative entries, thus totaling 256 bits. Each 16-bit entry may include an address of a data column in the row to be repaired, and an address of a single bit in the identified column. An additional bit may also be included indicating if a repair is to be performed or not.

Further referring to FIG. 2, each data column 204 is associated with extra storage cells or bits beyond a typical 256-bit column. These per-column bits are shown in FIG. 2 as a logically separate portion of the memory core, at 208, and may be referred to herein in aggregate as an "error array." For one embodiment, each data column 204 has an additional 16-bit resource in the error array to store parity information generated by an error correction code (ECC) corresponding to the data column, and one or more repair bit locations available for storing remapped bits from faulty bit locations in the data column.

With continued reference to FIG. 2, a representative data structure corresponding to the extra bits associated with each data column is shown in detailed portion labeled 2-2 in FIG. 2. For one specific embodiment, the ECC code corresponds to a single-error correct, double-error detect (SECDED) code having a (266, 256) format capable of correcting a single error or detecting a double error in a 256-bit column of data. The result of the coding includes the original 256 data bits, stored in the data array, and 10 parity bits that are stored in the error array portion of the corresponding data column.

In an alternate embodiment, and still referring to FIG. 2, the additional bits for each column may be reduced to, for example, 4-bits, such that only a parity bit is employed along with an enable bit and a pair of repair bits. An example of a data structure for the reduced bits is shown as detail 2-3 in FIG. 2. In such an embodiment, no error correction code is employed, and only a parity check is carried out to detect whether or not an error exists in the column. A form of remedial action might then be performed to re-transfer the originally requested data in an effort to remedy the detected error.

Further referring to FIG. 2, one embodiment for the core error logic 132 for each bank 122 includes sense amplifier circuitry 207 to first sense the tag column 206 for an accessed row R, then an addressed column 204 of storage cells in the data array. The sensed tag information is loaded into a tag register 208 and fed into tag compare logic 210 each time a different column in the same row is accessed. The address of each accessed data column is also fed into the tag compare logic to determine whether the given address is identified in the tag information as having an error bit. If an error in the column exists, the tag compare logic 210 generates an output that includes the column and bit location for one or more error locations. One or more enable bits are also output to indicate whether an error associated with the address was detected by the comparison with the tag information.

Figure 3:
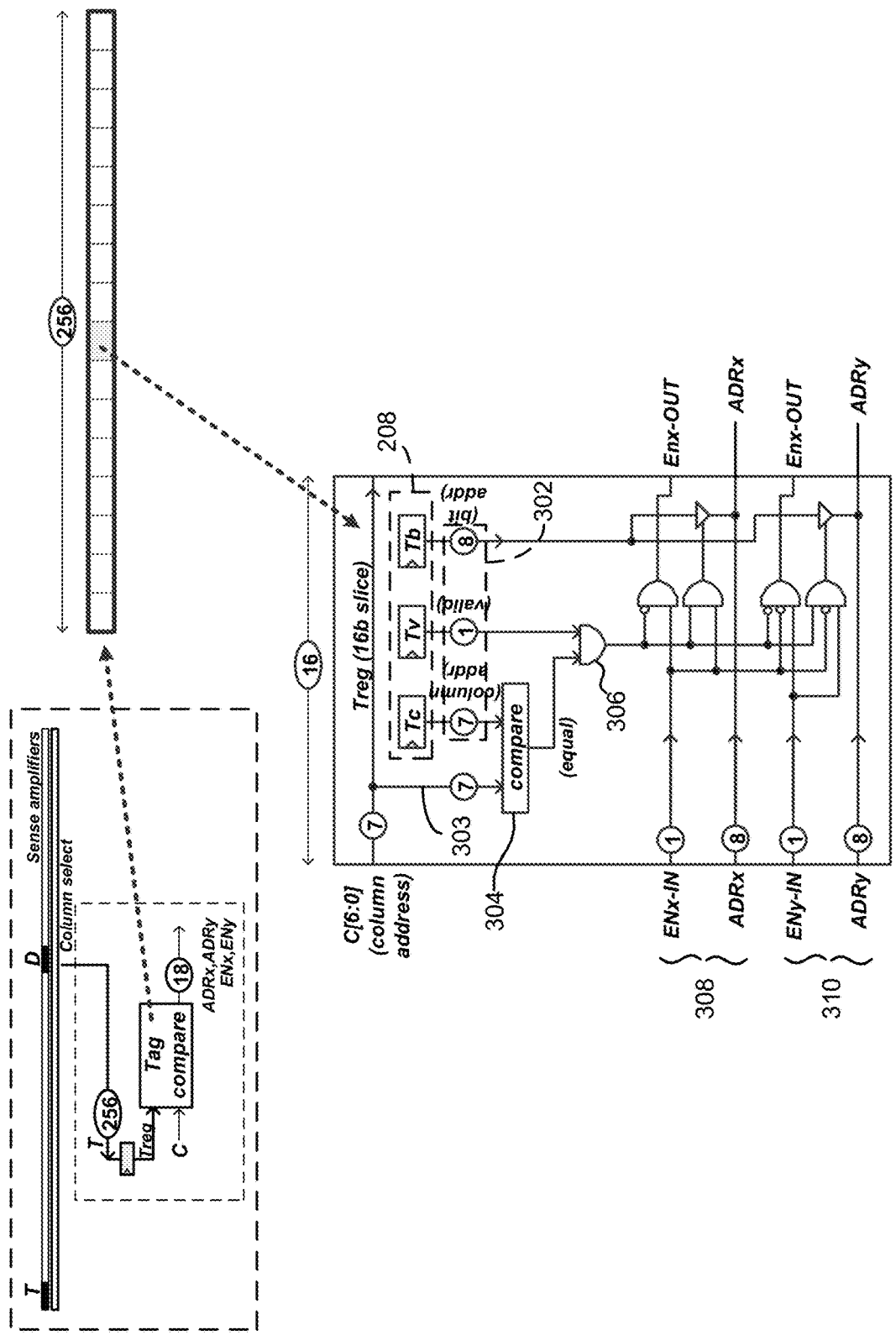
FIG. 3 illustrates one embodiment of tag compare logic for use in the bank of FIG. 3.

FIG. 3 illustrates further detail of a portion or "slice" of one embodiment of the tag compare logic 210 of FIG. 2. Each slice of the logic 210 includes a tag input 302 from the tag register 208 to receive a 16-bit portion of the tag information associated with the corresponding column associated with that "slice" of the tag compare logic. The "slice" also includes a column address input 303 to receive the 7-bit column address. The tag information includes a 7-bit column address that is fed to a comparator 304, a "valid" bit, and an 8-bit error location address that specifies a bit location in the column associated with an error (if an error exists). The comparator 304 generates a match signal in response to the column address being compared with a matching column address from the tag information. The match signal is then fed to an AND gate 306 which includes an enable input to receive the "valid" bit from the tag register associated with the tag column address. The valid bit serves as an enable signal to gate whether or not the column address is fed to one of two error paths 308 and 310. The embodiment described herein provides for a repair capability of two bit locations that may be identified via bit error addresses fed on paths ADRx and ADRy.

As explained above, and with further reference to FIG. 3, each time a given row is accessed, the sense amplifiers initially access the tag column 206, and feed the information into the tag register 208. Subsequent data column accesses to the same row involve feeding the address information into the tag compare logic 210, where the data column address is then compared to the tag information. If the address matches up with any of the tag fields identifying an error (where a bit substitution needs to take place), then one or more enable signals are sent along with the specific bit address information to the data/repair interface circuit 126, which carries out a bit substitution in the form of an insertion or extraction as more fully described below.

Figure 4:
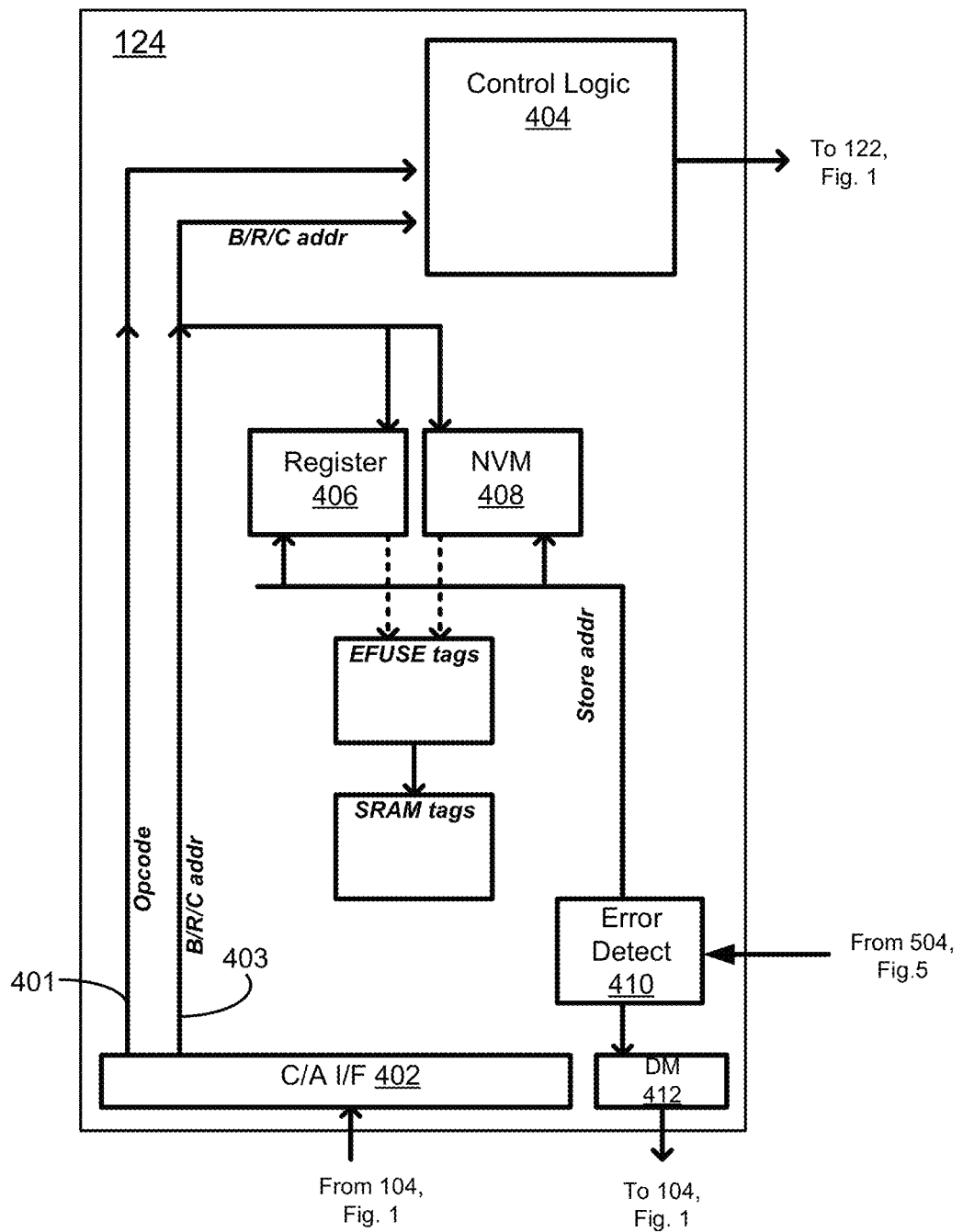
FIG. 4 illustrates one embodiment of control-address and repair interface logic employed by the memory device of FIG. 1.

Referring now to FIG. 4, one specific implementation of the C/A and repair interface logic 124 includes a C/A interface circuit 402 that receives control, command and address signals from the memory controller 102. The control, command and address signals are fed from the interface circuit 402 via respective opcode and address paths 401 and 403 to control logic 404 to access one or more banks 122 of the memory core 120. The address path 401 may be utilized in some embodiments to connect the C/A interface circuit 402 to one or more temporary storage elements such as an error register 406 and/or a nonvolatile error memory 408. An error detection circuit 410 couples to the error register 406 and/or error memory 408 to provide a control signal for the register/memory to store an address associated with a detected error location as data is retrieved from an addressed column, and decoded by error decoding circuitry in the data/repair interface logic 126, described more fully below. For one specific embodiment, a data mask (DM) interface 412 may be utilized for read operations to alert the memory controller 104 that an error has been detected for a given read data transfer.

Figure 5:
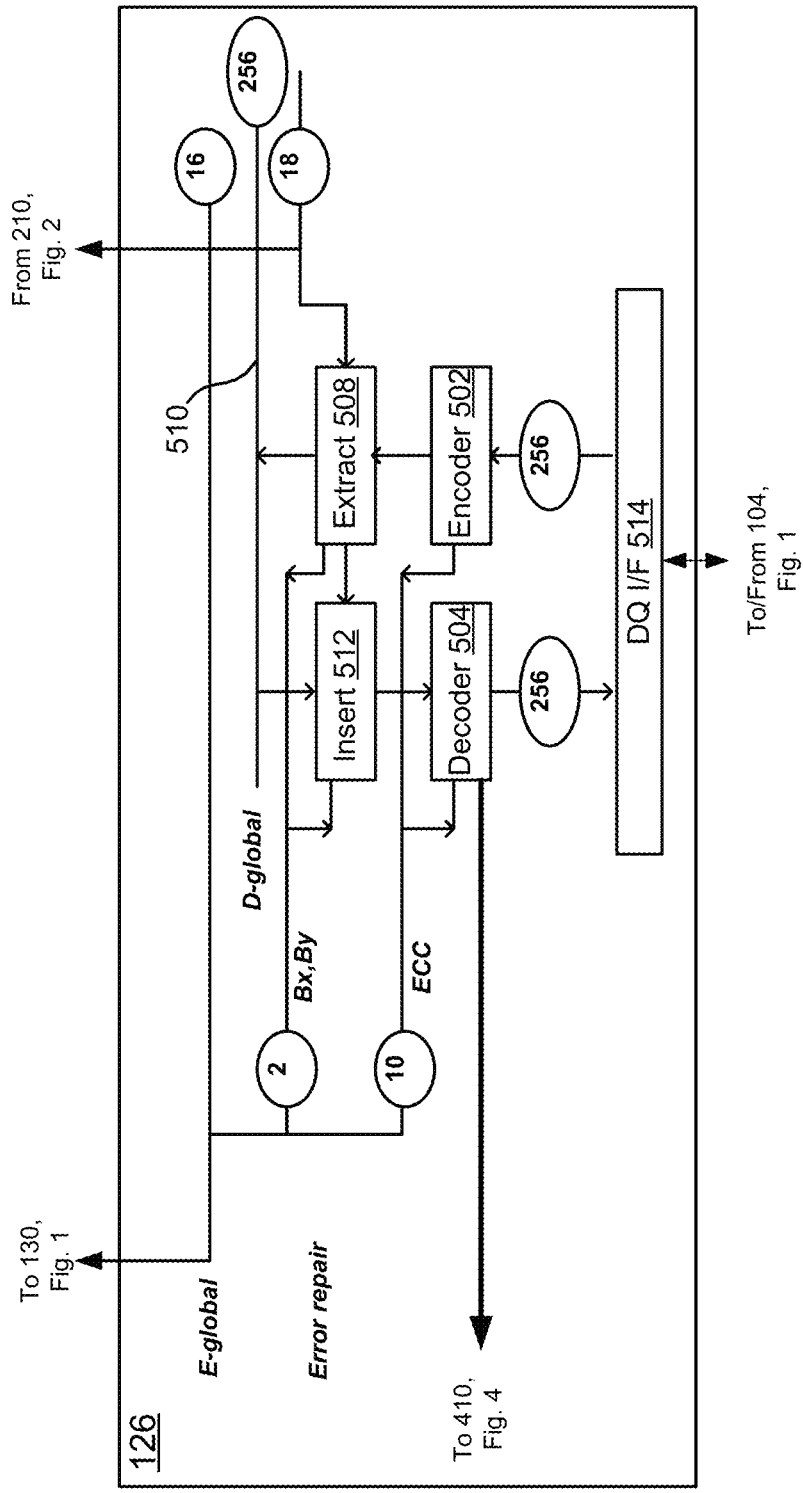
FIG. 5 illustrates one embodiment of a repair circuit for use in the data interface of FIG. 1.

With continued reference to FIG. 5, one embodiment of the data/repair interface logic 126 employs error code circuitry such as ECC logic that detects and corrects read and write errors with additional per-column repair resources in a way that enables the strength of the ECC code to be maintained without unreasonable overhead. For one embodiment, the error identification and repair is done in a manner wholly transparent to the memory controller 104, thus providing an additional layer of error correction capability that maximizes the ECC strength, or correction capability, of the coding carried out by the memory device 102.

Further referring to FIG. 5, the data/repair interface logic 126 generally includes a write data ECC encoder 502 and a read data decoder 504. The ECC encoder 502 encodes a given 256-bit column of data into 10 bits of parity information, and the original data. For write operations, the ECC parity bits generated by the encoder 502 are passed along a private internal bus 506 to be loaded into a portion of the error array 130 corresponding to the addressed column. The original column data passes to extract logic 508 and then to a global bus 510 for transfer to storage cells corresponding to the addressed bank, row and column in the memory core 120.

Figure 6:
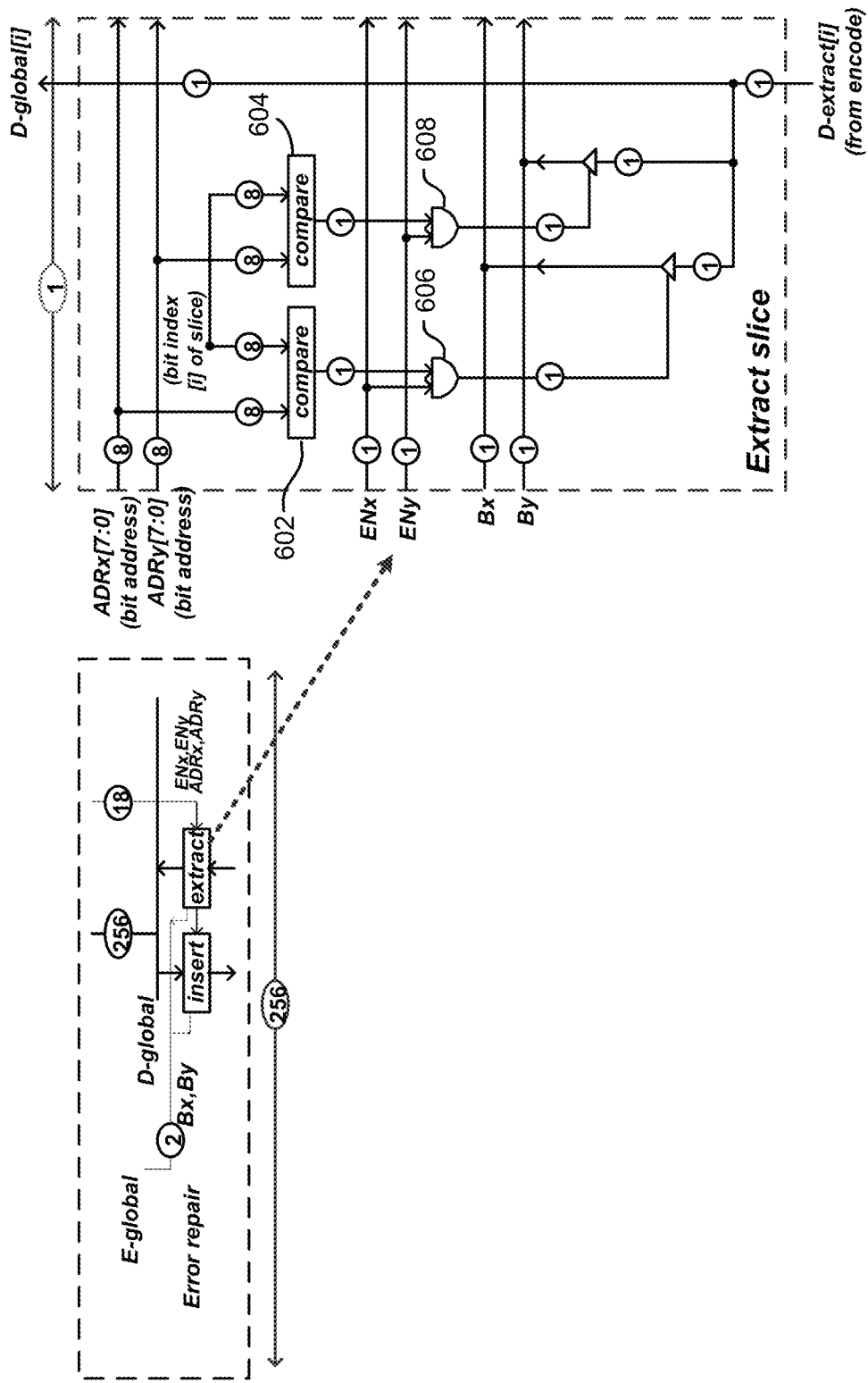
FIG. 6 illustrates an embodiment of extract logic that may be employed in the repair circuit of FIG. 5.

Referring now to FIG. 6, one specific implementation of the extract logic 508 is shown that receives an 18-bit control signal from the tag compare logic 210 specifying whether one or more specific bit locations are to have substituted bit locations. Respective comparators 602 and 604 are provided to compare the column address in the tag information to the column address of the incoming write column data. Respective enable signals ENx and ENy for each possible bit substitution provide a control mechanism as inputs to respective AND gates 606 and 608 in activating a bit extraction from the data involving one or more repair bit locations Bx and By.

Referring back to FIG. 5, the write data encoding may be generated in accordance with one of many acceptable ECC algorithms including, for example, straightforward single-bit Hamming codes, to more sophisticated high-speed BCH (Bose, Ray-Chaudhuri and Hocquenghem) codes. Other ECC codes, such as Reed-Solomon codes, turbo codes, cyclic redundancy codes (CRC) and low density parity check (LDPC) codes may also be acceptable. For one specific embodiment, a Single-Error Correct Double-Error Detect (SECDED) code is employed that is capable of correcting a single random error or detect a double bit error in a 256-bit column of data.

Figure 7:
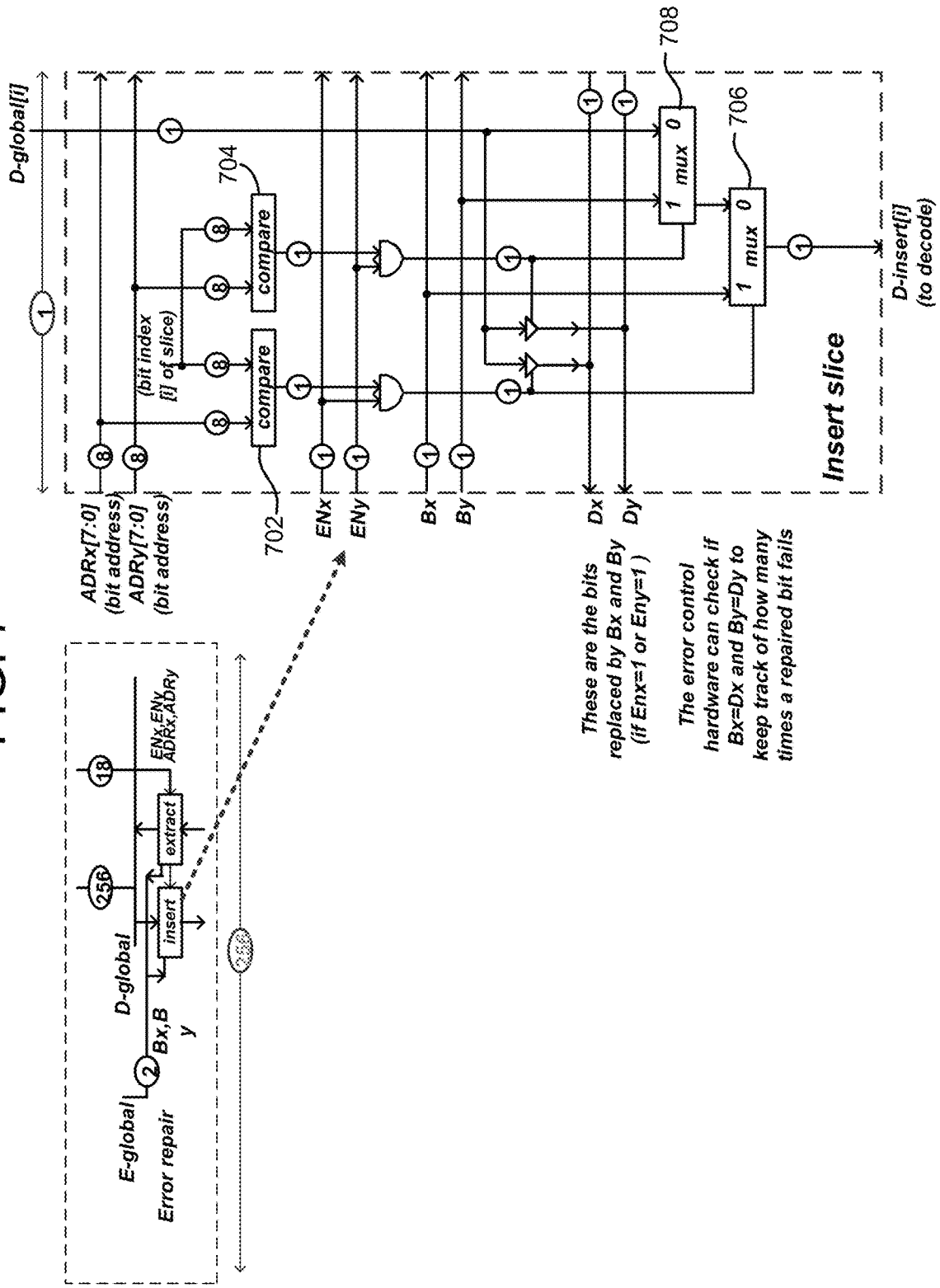
FIG. 7 illustrates an embodiment of insert logic that may be employed in the repair circuit of FIG. 5.

With additional reference to FIG. 5, for read operations, the data/repair interface logic 126 includes insert logic 512 coupled to the global data bus 510 to receive accessed column data. Additional detail concerning one specific embodiment of the insert logic 512 is shown in FIG. 7. Similar to the extract logic 508, the insert logic 512 receives bit repair address information from the tag compare logic 210, and compares the tag information to column addresses via comparators 702 and 704. Enable bits ENx and ENy provide a control mechanism to activate insertion of one or more substitute bits from the error array information (corresponding to the accessed column, as described above) into the accessed column of data via multiplexers 706 and 708.

Referring back to FIG. 5, the output of the insert logic 512 is fed to the ECC decoder 504 which also receives the parity information associated with the column data ECC encoding. In general, decoding the ECC syndrome following receipt of a data word allows for the detection of an error, and provides a pointer to the location of the error in the word. Should there be any errors detected by the decoder 504, the error information will be sent to the error detect circuit 410 in the C/A repair interface logic 124 (FIG. 4), and the tag information for the column updated accordingly. For some embodiments, updates to the tag information may be carried out during memory maintenance operations to minimize any latency impact to normal data transfer operations.

By detecting errors in the memory device 102, defective storage cells that form the basis for "hard" errors may be repaired for subsequent data transfers to and from the defective cells. This ensures that the error correction coding generated within the memory device 102 does not become overwhelmed by errors that may develop over time, thereby maintaining its error coding strength. Further, by handling the error detecting and repair in the memory device 102, very few if any changes to the circuitry in the memory controller 104 are needed to achieve the desired error tracking and repair functionality.

The memory architecture above lends itself well to providing an alternative way to carry out repairs at the discrete device manufacturing stage, such as when devices undergo functional test, and/or at the system level, such as when a memory module (having plural memory devices) undergoes final assembly and test. The architecture also advantageously provides repair capability during normal operation as a main memory system for computing resources. Failures identified during manufacture, such as in final module assembly and test, may be repaired as an alternative to, or complementary with, redundant row and column resources typically provided, and the repair information stored in the nonvolatile memory 228, until retrieved upon usage in a memory system operating environment.

Figure 8:
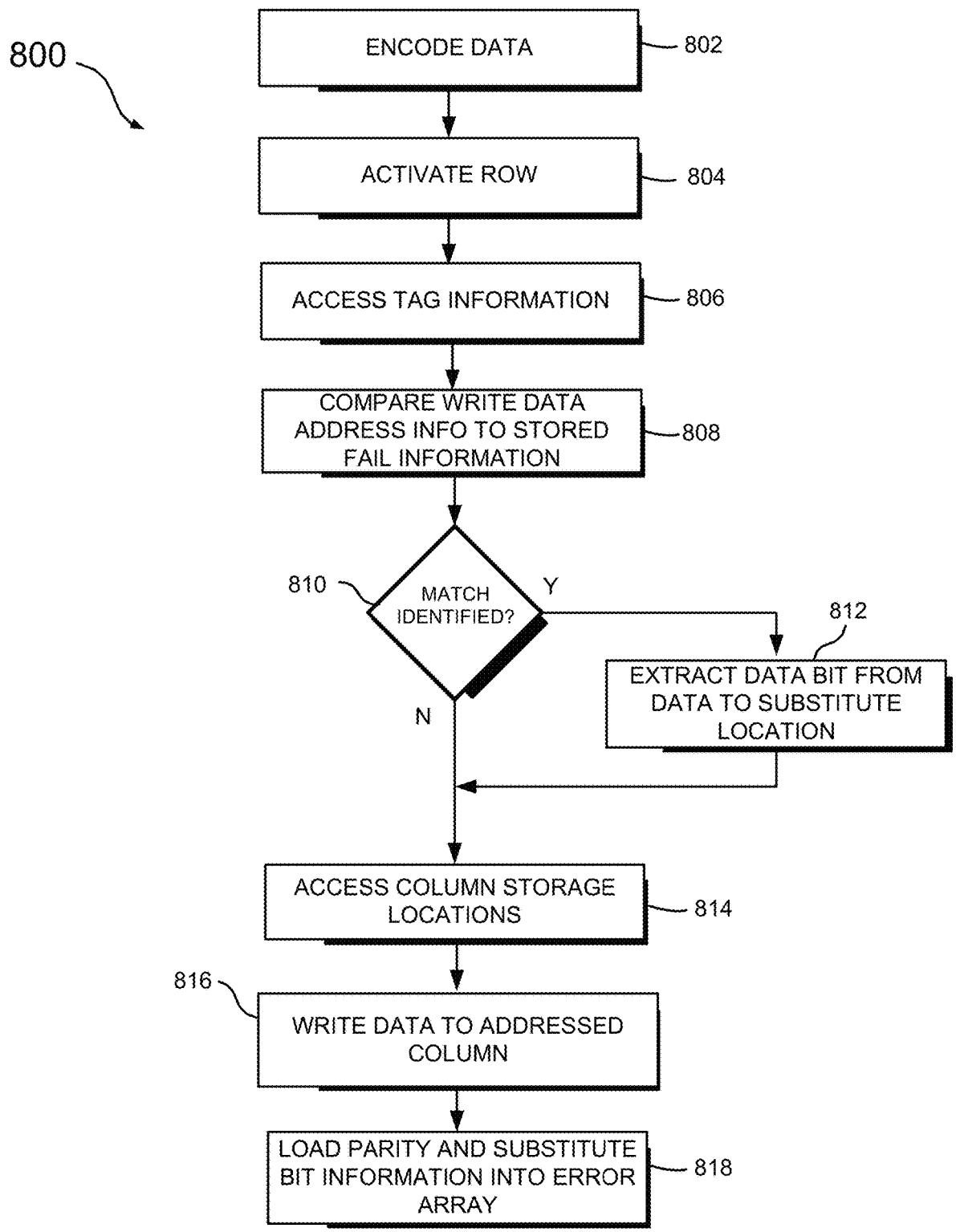
FIG. 8 illustrates a flowchart of steps carried out in a method of carrying out write operations for the memory device of FIG. 1.

FIG. 8 shows a flowchart of steps that may be performed in accordance with one embodiment of a repair method described herein during normal write operations using the circuitry described above and shown in FIGS. 1-7. The method, generally designated 800, seeks to take advantage of memory devices that employ error correction coding schemes, with little to no impact to the memory controller design. For some embodiments, an initialization procedure will have been carried out as the system is powered on. The initialization generally involves loading any previously stored error information, such as identified during manufacture or previous normal operations, from the nonvolatile storage into the tag information columns in the DRAM core. With the tag information stored in the DRAM core, normal repair operations may commence.

Referring still to FIG. 8, for a write operation that involves a given column of data (although many columns are usually involved in a given write operation), the data is first received by the memory interface and error encoded to generate ECC parity information, at 802. In response to a series of commands from the memory controller to write the specified column of data (in this example, a 256-bit column of data with an additional 10 parity bits generated by the ECC code) to a memory device, a corresponding row or page in an addressed bank is activated, at 804.

Further referring to FIG. 8, once the row is activated, the tag column in the row is first accessed and loaded into the tag register, at 806. The tag column may have error information previously loaded in response to an initialization routine, or updated as a result of previous transfer operations. The error information may specify a column address and bit location within the column address that corresponds to a hard error to be substituted by a spare bit location associated with the column. The column address involved in the write operation may then be compared to the known fail addresses stored in the tag information, at 808. If a match is identified, at 810, then a bit substitution in the form of a bit extraction may be made based on the failed bit location identified by the tag information, at 812. The addressed column may then be accessed, at 814, and the write data written into the data array, at 816. The column access also involves writing the ECC parity information associated with the column into the error array along with the extracted bit information, at 818. Write operations for additional column addresses may then be performed using the previously accessed tag information.

Figure 9:
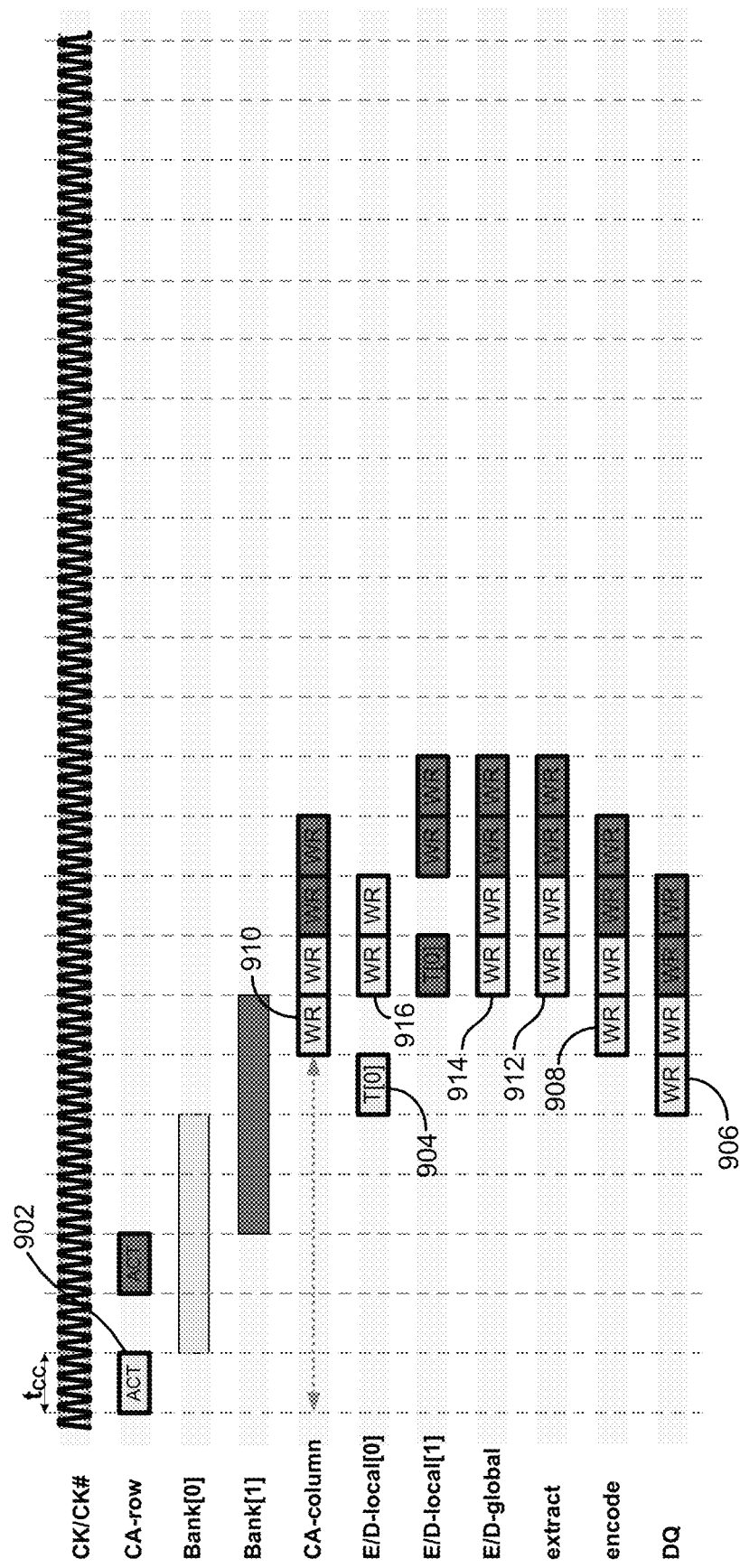
FIG. 9 illustrates a timing chart for pipelined write and repair operations involving the memory device of FIG. 1.

FIG. 9 illustrates a timing chart associated with pipelined write operations consistent with the method described above for FIG. 8. The waveform CK/CK #represents a timing reference for the write operations, where every four intervals of the clock corresponds to a column cycle time tCC. A tCC is a timing parameter that represents the minimum time necessary to carry out a column access. The timing chart illustrates write operations involving two banks Bank[0] and Bank[1], that operate in a round robin fashion. Respective shadings (light and dark) in the chart identify the respective bank operations, with the following detailed description focuses mainly on the bank Bank[0] (light grey) for purposes of brevity.

Further referring to FIG. 9, at 902, a row activate command ACT is received by the memory core. At 904, in response to activation of a given row by the activate command, the tag column T[0] is accessed that corresponds to the activated row. At this time, the column data to be written is received by the data/repair interface DQ, at 906. At 908, the column data undergoes ECC encoding, and a column write command is received, at 910. An extraction operation takes place, at 912, on the column data if the loaded tag information indicates a required bit substitution. The column data and extracted bit are then routed along respective buses, at 914, and the first column write operation to a data column of storage cells occurs, at 916.

Figure 10:
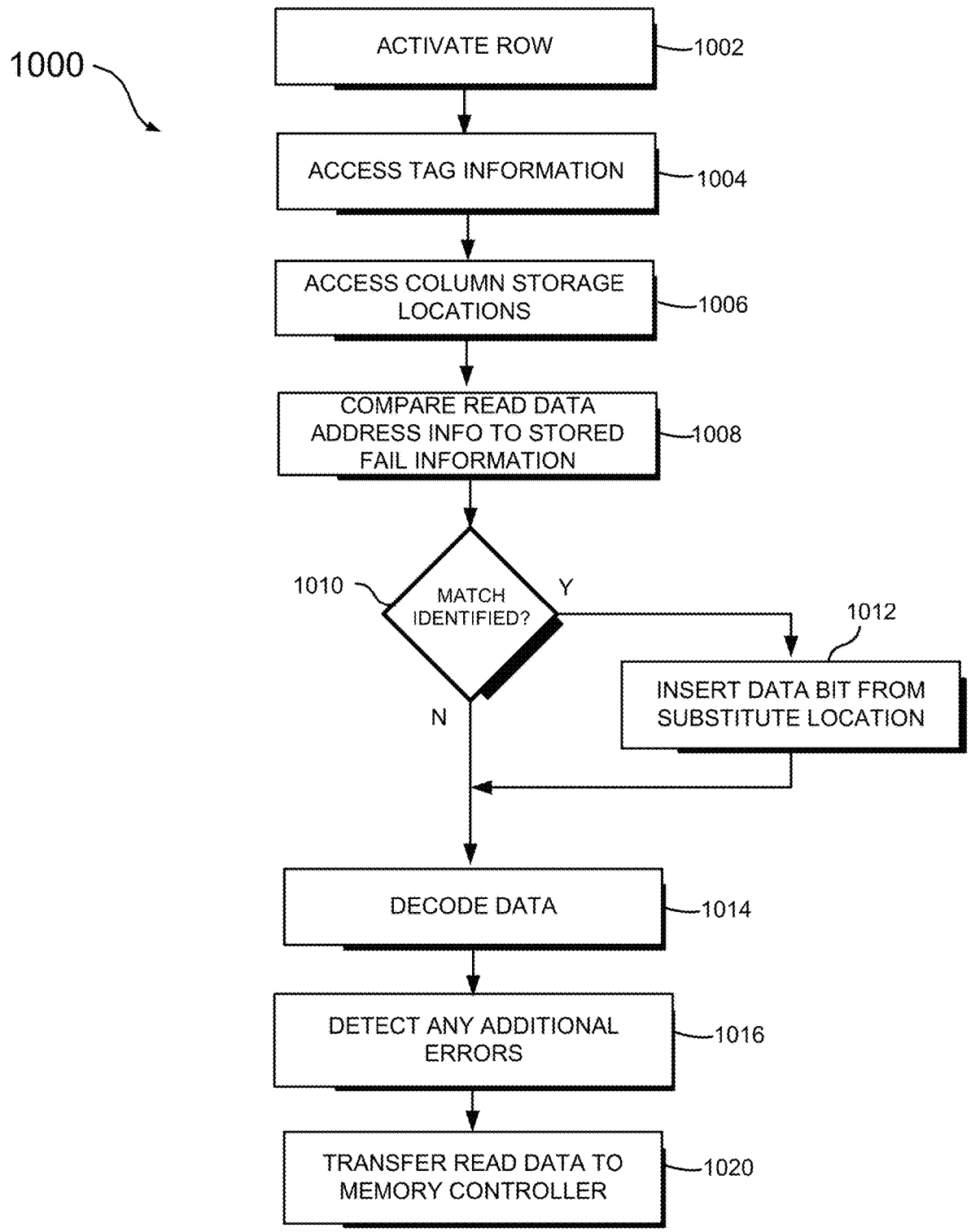
FIG. 10 illustrates a flowchart of steps carried out in a method of carrying out read operations for the memory device of FIG. 1.

FIG. 10 shows a flowchart of steps that may be performed in accordance with one embodiment of a repair method described herein during read operations, and generally designated 1000. The method assumes that an initialization routine has already been carried out, and that all tag information relating to the memory core has been stored in the designated tag columns. At 1002, an activate command activates a given row in an addressed bank. In response to the activate command, the tag information associated with the row is automatically accessed, at 1004. The addressed data column in the core is then accessed, at 1006. The address information associated with the data column is then compared to the tag information identifying any known failure locations within the column, at 1008. If the comparison results in a match, at 1010, then a data bit from a remapped storage cell is inserted into the bit location of the column of data that includes the known error, at 1012, and the corrected data decoded, at 1014. The decoded data may be evaluated for any additional errors, at 1016, which may be passed to the error detection circuit in the C/A repair interface logic. The read data is then transferred to the memory controller, at 1020. Note that the correction to the data is not being carried out by the decoding of the associated ECC, but rather through a substitution of data from a redundant cell mapped to store a bit value originally intended for a defective cell. Thus, the ECC is unaffected by the known (and corrected) error.

Figure 11:
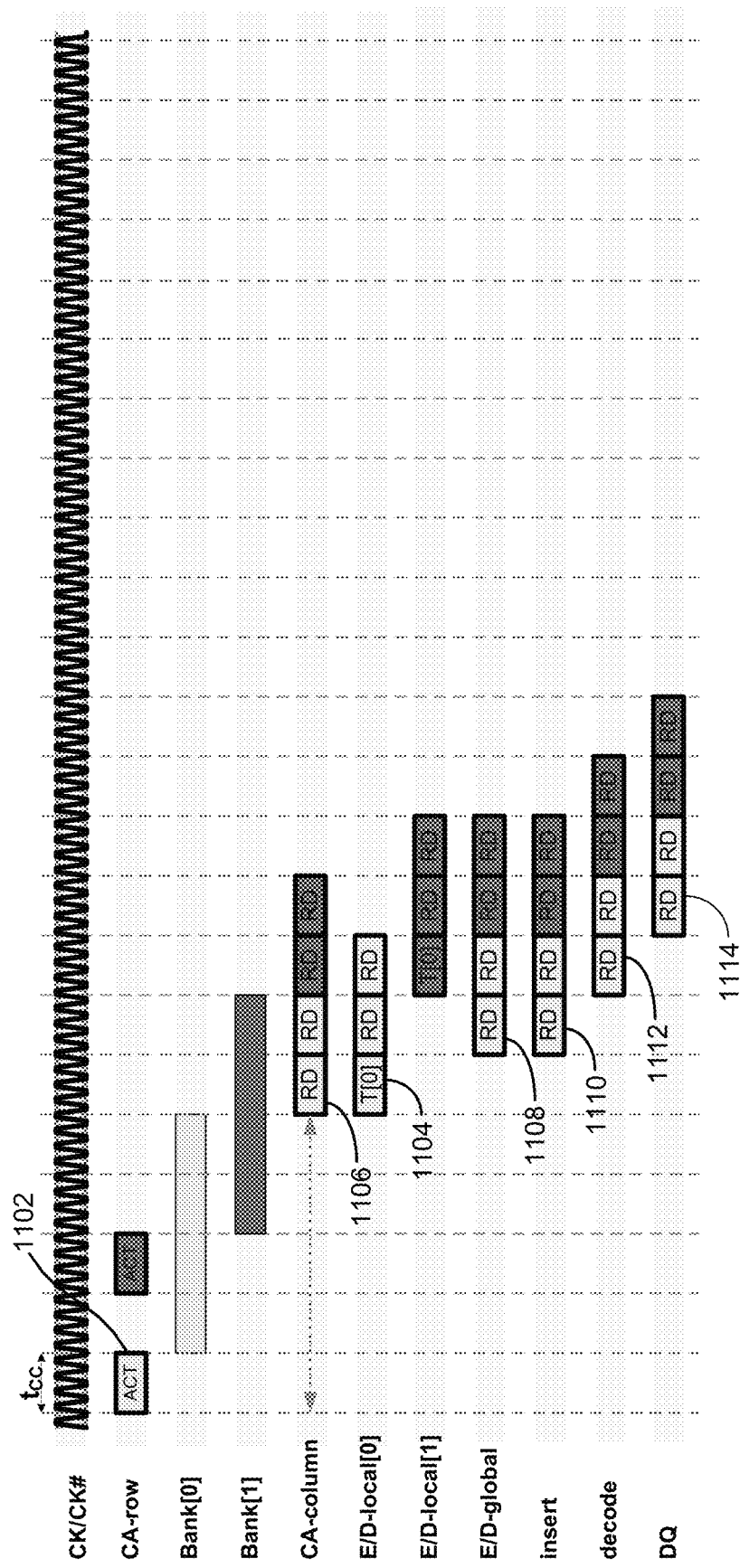
FIG. 11 illustrates a timing chart for pipelined read and repair operations involving the memory device of FIG. 1.

FIG. 11 illustrates a timing chart associated with pipelined read operations for a bank consistent with the method steps described above with respect to FIG. 10. Two banks operating in a round robin fashion are shown, with the description below focusing on the operations highlighted in light grey shading, associated with Bank[0]. Like the timing chart of FIG. 9, the waveform CK/CK #represents a timing reference for the read operations, where every four intervals of the clock corresponds to a column cycle time tCC. At 1102, a row activate command ACT is received by the memory core. In response to the activate command, at 1104, the tag column T[0] is accessed that corresponds to the activated row. At this time, a column read command is received by the core, at 1106. Column read data corresponding to the column address is accessed and the column address compared to the tag information, at 1108. If a match occurs where a data bit substitution is required, the bit is inserted into the appropriate bit location in the data, at 1110. The corrected data is then decoded, at 1112, to determine if any further errors are associated with the data. Following decoding, the data is then passed to the DQ interface for transfer to the memory controller, at 1114.

Figure 12:
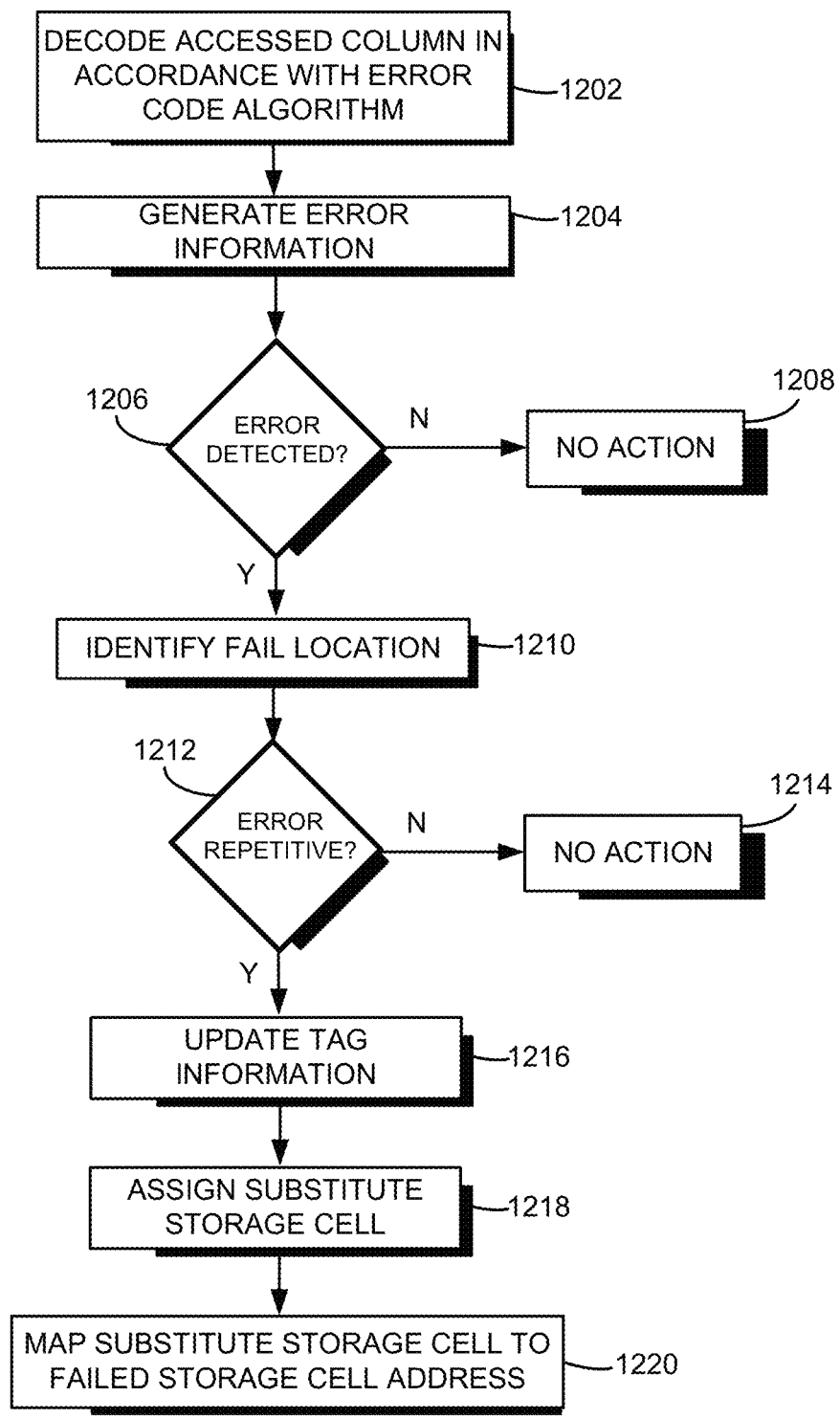
FIG. 12 illustrates a method of updating the tag information of FIG. 1.

FIG. 12 illustrates one embodiment of method steps that are involved when further errors are detected during read operations. As a read column of data is decoded, at 1202, error information may be generated, at 1204, such as through decoding of the syndrome associated with the data. Note that since a repair is to be made for subsequent accesses to a failed storage cell, the currently accessed data does not undergo a correction in the memory device, but rather at the memory controller (if an error is detected), or through a remedial read operation.

Further referring to FIG. 12, as a syndrome arrives at the C/A repair interface logic, a determination of whether an error was detected is first carried out by the error detection circuit, at 1206. This generally involves evaluating the syndrome, which not only detects the existence of an error, but also generates a pointer to the bit location of the error in the read data word. If no error is detected, no action takes place, at 1208, and the next error syndrome is evaluated on a subsequent cycle. If an error is detected, then the pointer is evaluated to identify the location of the error, at 1210. For some embodiments, a counter or other indicator may be employed to determine whether the error is a single event, or repetitive in nature, at 1212. If the error is not repetitive (based on a predetermined threshold, for example), no further action may take place, at 1214. If the error is repetitive, an assumption may be made that the error is the result of a failure in the associated memory cell, and the repair logic generates a tag entry for inclusion in the fail memory, at 1216. As explained above, the tag entry generally includes information such as the column address information and bit location of the failed cell.

Further referring to FIG. 12, with the tag generated and stored in the fail memory, the repair logic may then assign a substitute storage cell, at 1218, to store future data bits directed to the failed storage cell address. A mapping is then generated, at 1220, that associates the failed storage location address to the newly assigned substitute storage cell. Subsequent write data directed to the failed address location will then instead be extracted from the DQ data path internal to the memory device, and directed to the substitute storage cell in the error array. Subsequent reads that include that data bit will have the bit inserted into the read data word, as explained above. The substitution and corresponding mapping thus allows for the correction of far more errors to the memory device than could be available through ECC coding alone.

Those skilled in the art will appreciate that the various embodiments described herein improve error correction abilities for memory systems that employ error correction schemes. For embodiments that allow for corrections of an additional bit for a given data word, error detection, correction and repair for memory devices may be extended by several orders of magnitude. This may significantly extend memory device lifetimes, and/or prevent premature in-system device failures. Further, for some of the embodiments described herein, changes to the memory controller may be minimized, and instead incorporated into the memory device.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:
1. A memory device, comprising:
   memory core circuitry including multiple rows of data storage locations and error storage locations;

memory interface circuitry to receive a write command to activate a given row of the multiple rows of data storage locations and error storage locations; and repair circuitry, responsive to the write command, to access error information from the error storage locations of the activated given row, the error information used to generate a comparison result for a repair operation.

2. The memory device according to claim 1, wherein the error information includes:

address information identifying known failure locations within the activated given row.

3. The memory device according to claim 2, wherein the address information includes column address information of the known failure locations.

4. The memory device according to claim 1, wherein:

the repair circuitry is to selectively perform the repair operation by extracting a data bit from a column of write data that is associated with an address of a known failure location, and storing the data bit in a substitute storage location.

5. The memory device according to claim 4 wherein the repair circuitry further comprises:

comparison circuitry to perform a comparison result between the error information and a column address associated with the column of write data; and wherein the repair circuitry is to selectively perform the repair operation based on the comparison result.

6. The memory device according to claim 1 wherein the memory core circuitry comprises:

dynamic random access memory (DRAM) storage cells.

7. The memory device according to claim 1 wherein the error information comprises error correction code (ECC) parity information.

8. An integrated circuit (IC) memory chip, comprising:

memory core circuitry including multiple rows of storage locations, each row of storage locations including data locations to store data and error locations to store error information associated with the data;

memory interface circuitry to activate a given row of the multiple rows of storage locations in response to command information associated with a write operation; and repair circuitry, during the write operation, to access row-specific error information from the error locations of the activated given row, the row-specific error information used to generate a comparison result for a repair operation.

9. The IC memory chip according to claim 8, wherein the row-specific error information includes:

address information identifying known failure locations within the activated given row.

10. The IC memory chip according to claim 9, wherein the address information comprises:

column address information of the known failure locations.

11. The IC memory chip according to claim 8, wherein:

the repair circuitry is to selectively perform the repair operation by extracting a data bit from a column of write data that is associated with an address of a known failure location, and storing the data bit in a substitute storage location.

12. The IC memory chip according to claim 11, wherein the repair circuitry further comprises:

comparison circuitry to perform a comparison result between the error information and a column address associated with the column of write data; and wherein the repair circuitry is to selectively perform the repair operation based on the comparison result.

13. The IC memory chip according to claim 8 wherein the memory core circuitry comprises:

dynamic random access memory (DRAM) storage cells.

14. The IC memory chip according to claim 8, wherein the error information comprises error correction code (ECC) parity information.

15. A method of operation in an integrated circuit (IC) dynamic random access memory (DRAM) chip, comprising:

memory core circuitry including multiple rows of storage locations, each row of storage locations including data locations to storing data in data locations of a row of a memory core and error information associated with the data in error locations of the row;

activating the row in response to command information associated with a write operation; and performing a repair operation, during the write operation, by accessing the error information from the error locations of the row and comparing the error information to column address information associated with column data for writing to the row.

16. The method according to claim 15, wherein the error information includes:

address information identifying known failure locations within the row.

17. The method according to claim 16, wherein the address information comprises:

column address information of the known failure locations.

18. The method according to claim 15, wherein the performing of the repair operation further comprises:

extracting a data bit from a column of write data that is associated with an address of a known failure location, and storing the data bit in a substitute storage location.

19. The method according to claim 18, wherein the performing of the repair operation further comprises:

generating a comparison result between the error information and a column address associated with the column of write data; and selectively performing the repair operation based on the comparison result.

20. The method according to claim 15, wherein the error information comprises error correction code (ECC) parity information.

* * * * *